United States Patent
Kalinin et al.

(10) Patent No.: US 7,202,589 B2
(45) Date of Patent: Apr. 10, 2007

(54) TEMPERATURES STABLE SAW SENSOR WITH THIRD-ORDER ELASTIC CONSTANTS

(75) Inventors: Victor Alexandrovich Kalinin, Oxford (GB); Mark Lee, Totton (GB)

(73) Assignee: Transense Technologies PLC (GB)

( * ) Notice: Subject to any disclaimer, the term of this patent is extended or adjusted under 35 U.S.C. 154(b) by 318 days.

(21) Appl. No.: 10/492,724

(22) PCT Filed: Oct. 16, 2002

(86) PCT No.: PCT/GB02/04669

§ 371 (c)(1),
(2), (4) Date: Apr. 15, 2004

(87) PCT Pub. No.: WO03/034013

PCT Pub. Date: Apr. 24, 2003

(65) Prior Publication Data

US 2005/0001511 A1 Jan. 6, 2005

(30) Foreign Application Priority Data

Oct. 16, 2001 (GB) ................................. 0124831.9
Mar. 1, 2002 (GB) ................................. 0204940.1

(51) Int. Cl.
*H03H 9/25* (2006.01)
(52) U.S. Cl. ................................ 310/313 D; 310/313 R
(58) Field of Classification Search ............ 310/313 R, 310/313 A, 313 B, 313 D; 333/155; *H01l 41/08*
See application file for complete search history.

(56) References Cited

U.S. PATENT DOCUMENTS 3,889,205 A 6/1975 Mitchell
4,323,809 A * 4/1982 O'Connell ............... 310/313 A
4,325,038 A 4/1982 Coldren
4,434,383 A 2/1984 Cho et al.
4,602,182 A 7/1986 Webster
4,609,843 A 9/1986 Carr et al.
4,661,738 A 4/1987 Skeie
5,585,571 A 12/1996 Londale et al.
5,895,996 A 4/1999 Takagi et al.

FOREIGN PATENT DOCUMENTS

WO    WO 01/33180    5/2001

\* cited by examiner

*Primary Examiner*—Thomas M. Dougherty
(74) *Attorney, Agent, or Firm*—Keusey, Tutunjian & Bitetto, P.C.

(57) ABSTRACT

A surface acoustic wave (SAW) sensor includes a transducer (240 provided on a substrate (23), wherein the transducer (24) is oriented on the substrate (23) so that the direction of acoustic wave propagation is such that the variation of sensor output with temperature, associated with the variation of the substrate third-elastic constants with temperature, substantially equal but opposite to the sum total of the variation of sensor output with temperature associated with the substrate linear temperature coefficient of expansion and with the variations with temperature of the substrate non-zero third order elastic constants, the substrate first-order elastic constants and the substrate density. The effect of temperature variation on sensor output is thereby minimized. This is achieved with a 35-degree arrangement or with reflective gratings inclined at an angle of 3.1 degrees to normal. Additionally, a robust package with a dish is given. Particular applications include the measurement of torque.

17 Claims, 4 Drawing Sheets

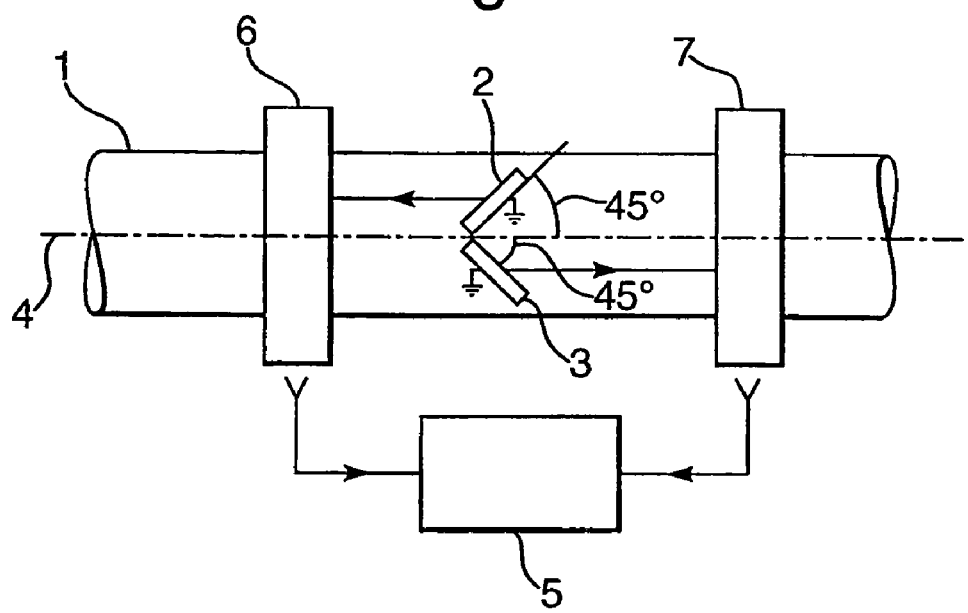
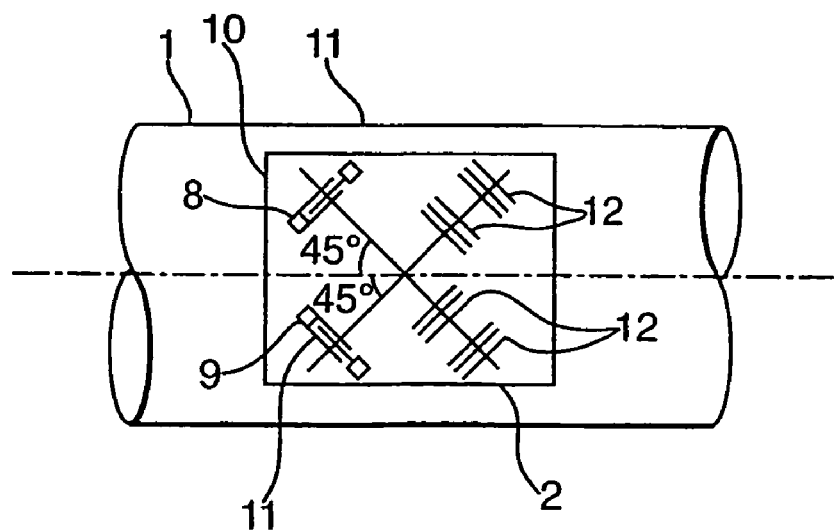

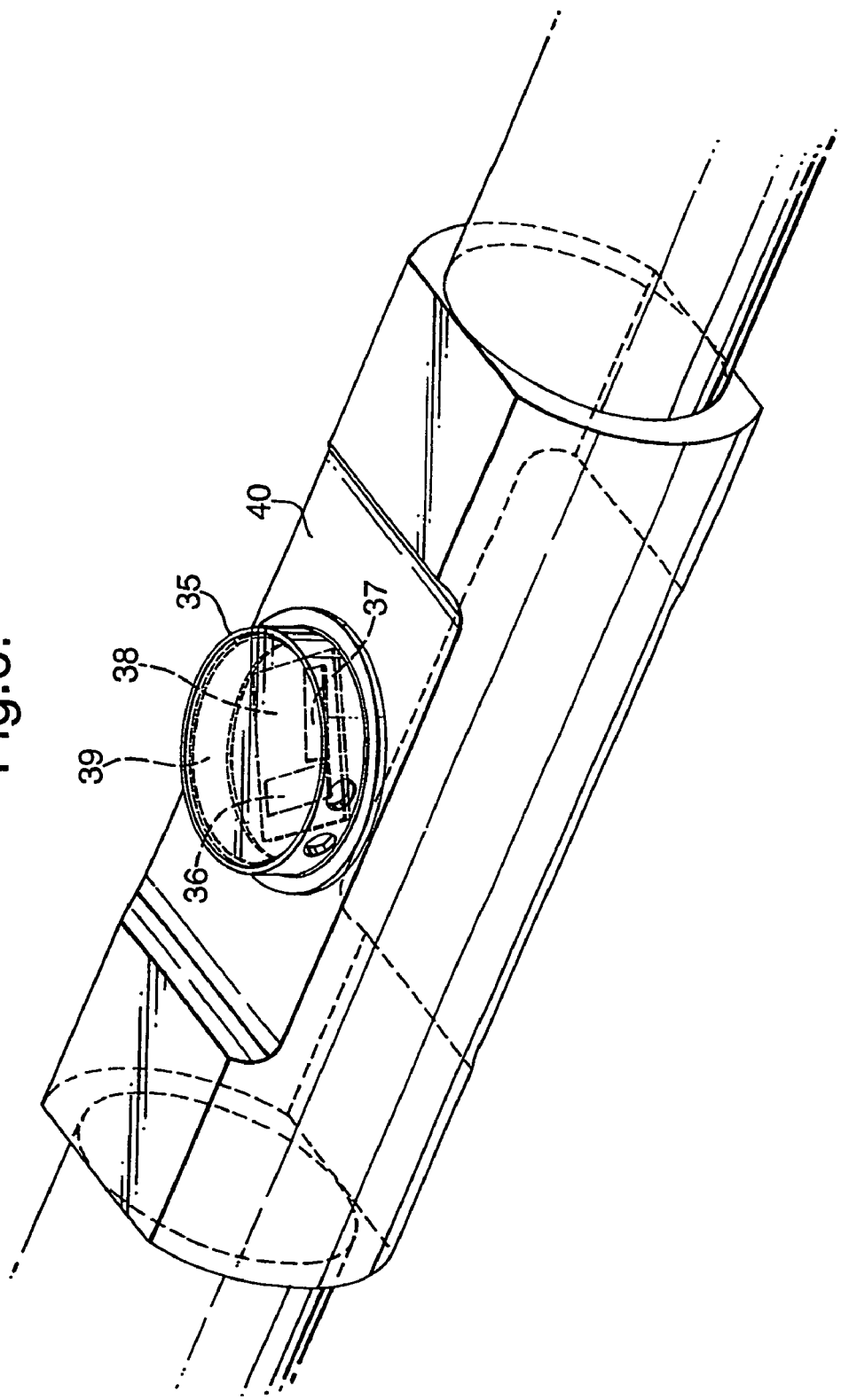

TEMPERATURES STABLE SAW SENSOR WITH THIRD-ORDER ELASTIC CONSTANTS

FIELD OF INVENTION

This invention relates to SAW sensors, that is to say sensors which make use of surface acoustic wave (SAW) devices for sensing a physical parameter.

DESCRIPTION OF THE RELATED ART

As will be appreciated by those skilled in the art, SAW devices may be used to detect changes in the physical dimensions of the substrate of the SAW device. The resonant frequency of a SAW device (in the case of a SAW resonator) or the group delay or phase delay of a SAW device (in the case of delay line SAW device) varies with changes to the dimensions of the substrate of the SAW device. Accordingly, by arranging the SAW device so that a change in a physical condition produces a change in the dimension of the substrate of the SAW device, the SAW device may be used to provide a measure of the physical condition in question—Typically, SAW devices may be utilized in this manner as strain gauges—One particular application of this technology is the measurement of torque. In this connection, one desirable characteristic of SAW devices is that they may be interrogated without providing a hard-wired electrical connection between the SAW device and its associated interrogation circuitry. This fact, combined with the fact that SAW devices can be operated passively (in other words, they can be operated without having a power supply directly associated with the SAW device) makes them ideal for measuring the torque in a rotating shaft.

One prior art system based on two SAW resonators is schematically illustrated in FIG. 1. In this system, two SAW resonators are secured to a shaft oriented at the angles of ±45° relative the shaft axis. When torque is applied to the shaft, the resonant frequencies of the resonators change in the opposite directions since one of the SAW devices is in tension and another one is in compression. An interrogation unit measures the difference between the two frequencies that is proportional to the torque. An RF signal is applied to the SAW devices via contactless RF couplers. Orientation of the SAW resonators at ±45° to the shaft axis ensures maximum sensitivity of the sensor.

Another system based on two SAW delay line devices is illustrated schematically in FIG. 2. In this system, the two SAW delay lines with reflecting gratings are also positioned at the angles of ±45° to the crystal axis of the substrate (which is aligned with the shaft axis). In this case, the interrogation unit measures either the group delay or the phase delay difference between the pulses in the impulse response of the two delay lines. The difference is also proportional to the torque. Delay line devices can either be fabricated on two different substrates as shown in FIG. 1 or they can be fabricated on a single substrate as shown in FIG. 2.

Because the resonant frequency of a SAW resonator or the delay characteristics of a SAW delay line device is dependent on the mutual spacing between the various surface elements of the device and the phase velocity of the SAW, care must be taken to ensure that any change in the physical dimensions of the substrate and the phase velocity of the SAW induced by variations in temperature are compensated for. The need for temperature compensation is particularly acute in the case of sensitive torque measurement devices where the changes in dimensions of the substrate and the phase velocity of the SAW produced by the strain induced by the torque to be measured are small, and may accordingly be comparable in value to the changes in dimension or phase velocity induced by temperature variation.

In the prior art, the problem of temperature stabilization was to an extent solved by control of the orientation of the surface components of the device relative to the crystal axes of the substrate. More particularly, care was taken to lay down the surface components of the device so that the direction of acoustic wave propagation was the same, relative to the crystal axes of the substrate, for both SAW devices. By this means, it was assumed that measuring the difference between the two resonant frequencies or the two delays automatically excluded temperature variations from the result because of the equal temperature coefficients of frequency (TCF).

In devices of the type shown in FIG. 1 the minimum absolute temperature variation of the frequency or the delay is obtained using ST-cut quartz and X-axis propagation of the acoustic wave since it gives zero linear TCF and small quadratic temperature variation around a turnover temperature. In devices of the type shown in FIG. 2 the ±45° alignment was considered desirable to maximize the strain induced in the SAW device substrate by torsional distortion of the shaft. The fact that both SAW device axes were aligned at the same angle to the X axis of the substrate (45°) meant that the TCFs of the two SAW axes were equal, and it was believed that this eliminated temperature dependent variations in the performance of the SAW devices, even though the TCFs were non-zero.

However, we have now found that this approach does not provide a complete temperature stabilization of the torque sensor; it works well only when there is no torque applied to the shaft. The reason for this is that the linear TCF depends on the strain in the substrate. When torque is applied, the TCF of the compressed SAW device differs from the TCF of the SAW device under tension. In the case of ST-X cut quartz substrate with zero TCF, the strain modifies the turnover temperature. As a result the sensitivity of the torque sensor changes with temperature. For instance, if the two SAW devices are fabricated on ST cut quartz with the orientation in X direction, the sensitivity increases by 37% when the temperature changes from −40° C. to +90° C. This variation is unacceptably large in many industrial applications.

SUMMARY

The main factors contributing to the temperature variation of the sensitivity are:
1. Linear temperature coefficient of expansion,
2. Non-zero third-order elastic constants,
3. Temperature variation of the first-order elastic constants,
4. Temperature variation of the substrate density,
5. Temperature variation of the third-order elastic constants.

In the case of the conventional ST-X cut quartz substrate the last of these factors, the temperature variation of the third order elastic constants, is substantially larger than the other factors and dominates the net result of the various factors. To a large extent, the temperature variations in sensitivity are caused, in the case of ST-X cut quartz substrates, by the temperature variations of the third order elastic constants.

We have now found a means by which the overall temperature sensitivity may be substantially reduced. This desirable characteristic is achieved by reducing the temperature variation of the third order elastic constants of the substrate to a level at which, to a significant extent, they are cancelled out by the net result of the other four factors outlined above. In other words, we have found that if factor 5 outlined above is reduced to a level at which it is substantially equal, and opposite, to the sum effect of factors 1–4, a device can be produced which has a very low variation of sensitivity with temperature.

In accordance with one preferred embodiment of the invention the surface components of a SAW devices are laid down on a substrate of ST-cut quartz so that the surface acoustic waves propagate at an angle relative to the X axis of the ST-cut quartz at which temperature variations of the third order elastic constants of the substrate are substantially equal and opposite to the sum total of the variations in linear temperature coefficient of expansion, non-zero third order elastic constants, temperature variation of the first order elastic constants, and temperature variations of the substrate density.

Preferably, in the case of embodiments of the present invention, the sum total of the variations with temperature of the five factors indicated above lead to a variation in sensitivity of less than 10% and preferably of approximately 6%, within the temperature range −40° C. to +90° C. Such a characteristic is approximately six times better than in the case of conventional SAW devices where ST-X cut quartz is used for the substrate and the surface components of the SAW devices are laid down such that the surface acoustic waves propagate along the X axis.

It will be appreciated that the proposal that the axis of propagation of the surface acoustic waves is at an angle to the X axis of ST-cut quartz substrate of other than 0° or ±45° is contrary to the accepted teaching in the art, namely that it is desirable to make use of the zero linear TCF characteristic which is achieved if the surface acoustic waves propagate in the direction of the X axis of the ST-cut quartz substrate or the maximum sensitivity which is obtained if the surface acoustic waves propagate at ±45° to the X axis.

In the preferred embodiment of the invention using ST-cut quartz as a substrate the surface components of the SAW device are laid down so that the surface acoustic waves propagate at an angle of between 30° to 40° relative to the X axis. In a particularly preferred embodiment of the invention the acoustic waves propagate at an angle substantially equal to 35° relative to the X axis.

In order to optimize reflection from the gratings oriented perpendicularly to the above propagation angle, the strips of the grating are preferably gold or copper or other material causing substantial mass loading of the surface of the quartz substrate, rather than of aluminum, which would be standard in gratings oriented along the X axis of ST-cut quartz.

BRIEF DESCRIPTION OF THE DRAWINGS

The invention will be better understood from the following description of a preferred embodiment thereof, given by way of example only, reference being had to the accompanying drawings wherein:

FIG. 1 illustrates a prior art torque measuring device making use of two SAW resonators laid down on separate substrates;

FIG. 2 illustrates a prior art torque measuring device making use of two SAW delay line devices laid down on a common substrate;

FIG. 6 illustrates an assembled protective package for SAW resonators.

DETAILED DESCRIPTION OF PREFERRED EMBODIMENTS

Figure 3:
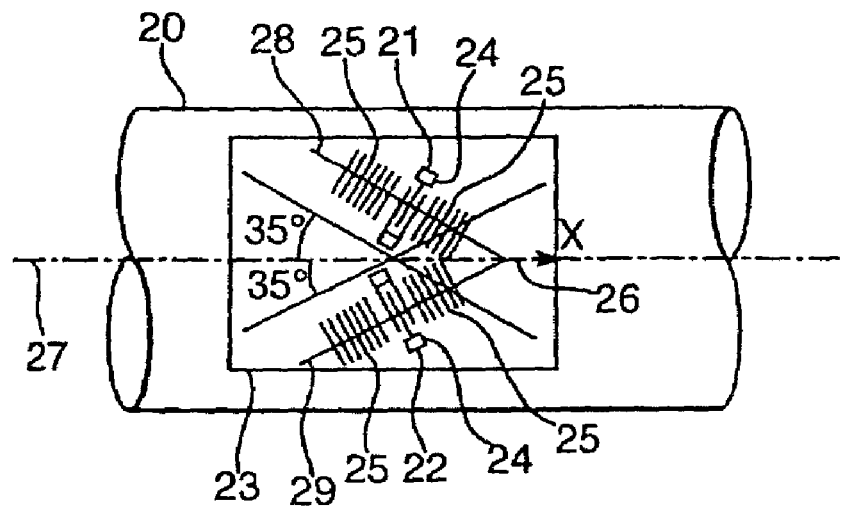
FIG. 3 illustrates a preferred first embodiment of the invention.

Referring firstly to FIG. 1, there is illustrated an arrangement for measuring the torque carried by a shaft 1. The arrangement comprises SAW devices 2,3 secured to the surface of the shaft and each oriented at substantially 45° to the axis of rotation 4 of the shaft. The SAW devices comprise separate respective substrates, typically of quartz material, on which are laid down surface conductors to form a surface acoustic wave device. The surface acoustic wave devices may be resonators or delay line devices. The devices are interrogated by an interrogation apparatus 5 via contactless RF connections 6,7. The above arrangement is known. Heretofore, the surface components of the SAW devices were laid down on the substrates so that the direction and propagation of the surface acoustic waves was parallel to the X axis of the ST-cut quartz substrate crystal or the Z axis of Y-cut $LiNbO_3$.

In the arrangement shown in FIG. 2 two SAW devices 8,9 are laid down on a single quartz substrate 10. The devices 8,9 are both delay line devices each of which comprises an acoustic wave transmitter/receiver 11 and two reflective gratings 12. In the case of each device 8,9 the direction and propagation of acoustic waves is along a respective X axis of the ST-cut quartz substrate.

As described above, the arrangements of FIGS. 1 and 2 are conventional.

Referring now to FIG. 3, a preferred embodiment of the invention is illustrated. A shaft 20 has secured thereto a pair of SAW devices 21,22. The SAW devices each comprise surface components laid down on a common substrate 23. The substrate may be of any suitable material, and would typically be ST cut quartz.

The SAW devices 21,22 are both delay line or resonator devices, which incorporate acoustic wave transducers 24 and reflective gratings 25.

The substrate 23 is secured to the shaft 20 with the Xaxis 26 of the substrate substantially aligned with the rotational axis 27 of the shaft. The surface components forming the SAW devices 21,22 are laid down such that the axes of the propagation 28,29 of the acoustic waves are each angled at an angle of 35° relative to the X-axis of the substrate. For this arrangement, each of the SAW devices does not have the perceived benefit of the prior art of zero TCF. However, we have found that with an arrangement of this type the temperature variations in sensitivity produced by the temperature variations of the third order elastic constants is close to, and opposite in sign from, the net variations in temperature sensitivity due to linear temperature co-efficient of expansion, non-zero third order elastic constants, temperature variations of the first-order elastic constants and temperature variations of the substrate density. In practice, we have found that with such arrangements an overall variation in sensitivity of approximately 6% can be achieved within the temperature range −45° C. to +90° C. Further, it is believed that by appropriate selection of characteristics of the shaft 20, it may be possible to reduce still further temperature dependant variations in sensitivity since it may be possible to compensate for the residual 6% variations outlined above by equal and opposite changes produced by variations in the shaft elastic constants with temperature.

Whilst the invention has been described with particular reference to an embodiment in which two SAW devices are laid down on a common substrate, it is to be appreciated that the invention may be applied to arrangements in which two or more separate SAW devices are utilized, for example in the manner illustrated in FIG. 1. Under these circumstances, each SAW device is laid down on its respective substrate so that the propagation direction of the acoustic waves is at an appropriate angle to the X-axis of the ST-cut quartz substrate.

Also, it will be appreciated that whilst the invention has been described with particular reference to torque measurement, the techniques described may be applied to other measurements in order to reduce temperature dependent changes in sensitivity which would otherwise exist.

The invention has been described in the context of a substrate of ST-cut quartz. With such a substrate, the preferred direction of acoustic wave propagation is ±35° relative to the X-axis. The invention may, however, be workable with other substrates. The critical aspect of the invention with other substrates is that the direction of propagation relative to a defined axis of the substrate is such that the frequency sensitivity variation with temperature due to variations of the third order elastic constants is equal and opposite to the frequency sensitivity variation with temperature due to the combined effect of the linear temperature coefficient of expansion, the non-zero third order elastic constants, temperature variations of the first order elastic constants and the temperature variations of the substrate density with the result that changes in the various factors move to minimize temperature variations in the sensitivity of the device.

The embodiment described above has an advantage of a small (around 6%) variation of the torque sensitivity with temperature. However, it has a disadvantage of having a nonzero linear temperature coefficient of frequency (TCF) at room temperature. This means that the absolute variation of the resonant frequencies of both resonators with temperature will be larger than for the devices oriented, for instance, along the X-axis of the ST-cut quartz substrate. In some applications this might be undesirable.

Figure 4:
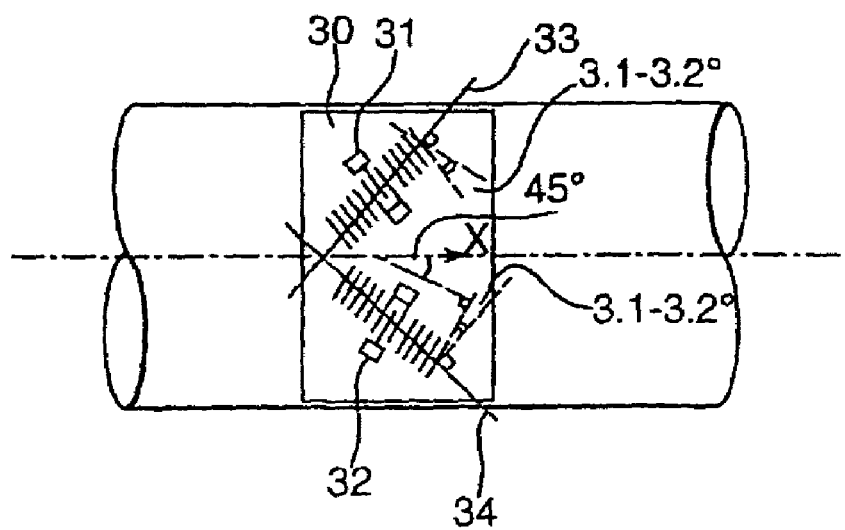
FIG. 4 illustrates a second embodiment of the invention.
Figure 5:
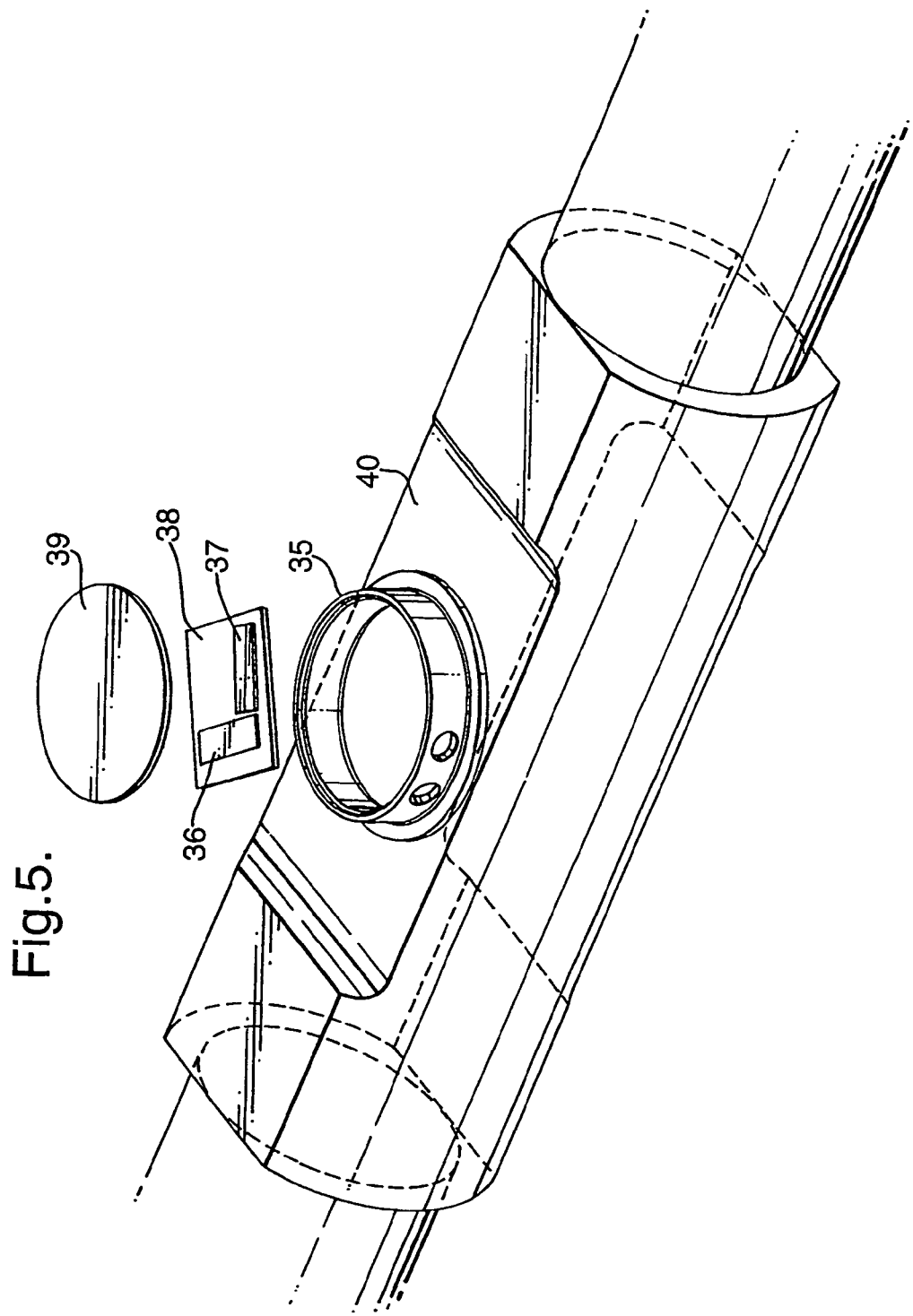
FIG. 5 illustrates a disassembled protective package for two or more SAW resonators.

The further embodiment shown in FIG. 4 has an advantage of using a single substrate 30 for both SAW resonators 31,32 oriented at 90° to each other (which gives a maximum sensitivity to the torque) and having zero linear TCF for both resonators. The variation of the torque sensitivity with temperature is approximately 12% within the range from −40° to +90° C., which is worse than for the previous embodiment but still better than for the traditional devices fabricated on ST-X cut quartz. Both SAW resonators have axes 33,34 oriented at 45° to the X-axis of the substrate made of Y+34° cut quartz. Electrodes of the IDTs and reflectors of the gratings are inclined at an angle of 3.1°–3.2° to the associated resonator axis 33,34 in order to account for the difference between the directions of the phase and the group velocities of SAW. Finally, the substrates of the above mentioned SAW sensors can be attached directly to the shaft by means of an adhesive (glue) solder or any other joining technique as shown in FIGS. 3 and 4 and the working surface of the devices can be protected by lids preferably made of quartz and attached to the substrates by, for example, an adhesive. A more robust design can use a package 35 as shown in FIGS. 5 and 6. The package 35 is a dish (preferably of a cylindrical shape) and the SAW devices 36,37 (either on separate substrates or on a single substrate 38) are firmly attached to the bottom of the package 35 at the required angle. The package 35 is sealed with a lid 39 and attached to the shaft 40 either by using adhesive or solder, or by welding it around the circumference of the package.

The invention claimed is:

1. A Surface Acoustic Wave (SAW) strain sensor, comprising: two one port resonators provided on a substrate with their axes of propagation inclined to each other, wherein the resonators are orientated on the substrate so that a direction of acoustic wave propagation is such that variation in strain sensitivity of the difference between the two resonant frequencies with temperature, associated with a variation the substrate third-order elastic constants with temperature, is substantially equal but opposite to a sum total of a variation of the strain sensitivity with temperature associated with the substrate's linear temperature coefficient of expansion, with variations with temperature of the substrate first-order elastic constants and the substrate density.

2. A SAW strain sensor as claimed in claim 1, wherein the substrate is ST-cut quartz and the two resonators are orientated on the substrate so that their respect directions of acoustic wave propagation are each at an angle of between 30° and 42° to the X-axis of the substrate, the transducers being symmetrically disposed relative to the X-axis.

3. A SAW strain sensor as claimed in claim 2 wherein said angle is between 30° and 40°.

4. A SAW strain sensor as claimed in claim 3, wherein said angle is 35°.

5. A SAW strain sensor as claimed in claim 1, wherein the substrate is Y+34° cut quartz and two transducers are orientated on the substrate so that their respective directions of acoustic propagation are each at substantially 45° to the X direction of the substrate.

6. A SAW strain sensor as claimed in claim 1, the sensor further comprising reflective gratings in the form of strips of material orientated parallel with one another and with electrodes of a transducer.

7. A SAW strain sensor as claimed in claim 6, wherein the reflective gratings are positioned on the substrate so that a straight line bisects the gratings and the transducer, the straight line extending at an angle to the direction of acoustic wave propagation.

8. A SAW strain sensor as claimed in claim 7, wherein said angle between the straight line and the direction of acoustic wave propagation is 3.1°–3.2°.

9. A Surface Acoustic Wave (SAW) sensor, comprising:
a transducer provided on a substrate subject to a plurality of temperature variation effects;
a first temperature variation effect provided as a result of an orientation of the transducer on the substrate such that the first temperature variation effect reduces or cancels out temperature variations due to other temperature variation effects, the sensor further comprising reflective gratings in the form of strips of material orientated parallel with one another and with electrodes of the transducer.

10. A SAW sensor as claimed in claim 9, wherein the substrate includes ST-cut quartz and two transducers are orientated on the substrate so that their respect directions of acoustic wave propagation are each at an angle of between 30° and 42° to the X-axis of the substrate, the transducers being symmetrically disposed relative to the X-axis.

11. A SAW sensor as claimed in claim 10 wherein said angle is between 30° and 40°.

12. A SAW sensor as claimed in claim 3, wherein said angle is 35°.

13. A SAW sensor as claimed in claim 9, wherein the substrate is Y+34° cut quartz and two transducers are orientated on the substrate so that their respective directions of acoustic propagation are each at substantially 45° to the X direction of the substrate.

14. A SAW sensor as claimed in claim 9, wherein the reflective gratings are positioned on the substrate so that a straight line bisects the gratings and the transducer, the straight line extending at an angle to the direction of acoustic wave propagation.

15. A SAW sensor as claimed in claim 14, wherein said angle between the straight line and the direction of acoustic wave propagation is 3.1°–3.2°.

16. A SAW sensor as claimed in claim 9, wherein the first temperature variation effect includes a variation of the substrate third-order elastic constants with temperature.

17. A SAW sensor as claimed in claim 16, wherein the other temperature variation effects include at least one of: a variation of sensor output with temperature associated with the substrate's linear temperature coefficient of expansion, variations with temperature of the substrate first-order elastic constants, variations with temperature of the substrate's non-zero third-order elastic constants and the substrate density.

* * * * *

UNITED STATES PATENT AND TRADEMARK OFFICE
CERTIFICATE OF CORRECTION

| | | |
|---|---|---|
| PATENT NO. | : 7,202,589 B2 | Page 1 of 1 |
| APPLICATION NO. | : 10/492724 | |
| DATED | : April 10, 2007 | |
| INVENTOR(S) | : Victor A. Kalinin et al. | |

It is certified that error appears in the above-identified patent and that said Letters Patent is hereby corrected as shown below:

Column 6, Claim 1, Line 13 after "variation" delete "the" and insert -- of --.

Signed and Sealed this

Fifth Day of June, 2007

JON W. DUDAS
*Director of the United States Patent and Trademark Office*